(12) United States Patent
Takai

(10) Patent No.: US 6,932,500 B2
(45) Date of Patent: Aug. 23, 2005

(54) WAVELENGTH VARIABLE LIGHT SOURCE APPARATUS WITH AN OPTICAL CONNECTOR BETWEEN A LIGHT SOURCE SLOT SECTION AND A MAIN CONTROL SECTION

(75) Inventor: Hironori Takai, Hamamatsu (JP)

(73) Assignee: Yokogawa Electric Corporation, Tokyo (JP)

(*) Notice: Subject to any disclaimer, the term of this patent is extended or adjusted under 35 U.S.C. 154(b) by 176 days.

(21) Appl. No.: 10/419,345

(22) Filed: Apr. 21, 2003

(65) Prior Publication Data

US 2003/0202351 A1 Oct. 30, 2003

(30) Foreign Application Priority Data

Apr. 26, 2002 (JP) .................................... P 2002-126167

(51) Int. Cl.[7] .................................................. H01S 3/10
(52) U.S. Cl. .................. 362/553; 362/231; 362/259; 356/433; 356/484; 398/95
(58) Field of Search .............................. 362/553, 231, 362/259, 3, 12, 16, 17, 551, 555, 227, 230, 257; 356/433, 484, 497, 432, 434, 213, 217, 229, 230, 454, 451, 456, 485, 496; 370/241, 249; 398/95, 9, 16, 43–47, 58, 79, 82–88, 91, 93; 315/224, 291, 149–159

(56) References Cited

U.S. PATENT DOCUMENTS

| | | | | |
|---|---|---|---|---|
| 3,757,106 A | * | 9/1973 | Bau et al. | 362/231 |
| 4,642,804 A | * | 2/1987 | Personick | 398/91 |
| 4,658,394 A | * | 4/1987 | Cheng et al. | 398/70 |
| 5,005,166 A | * | 4/1991 | Suzuki et al. | 398/47 |
| 5,086,349 A | * | 2/1992 | Okayama et al. | 398/48 |
| 6,043,883 A | * | 3/2000 | Leckel et al. | 356/454 |

* cited by examiner

*Primary Examiner*—John Anthony Ward
*Assistant Examiner*—Ismael Negron
(74) *Attorney, Agent, or Firm*—Fish & Richardson P.C.

(57) ABSTRACT

A wavelength variable light source apparatus includes a light source slot section for generating laser light and a main control section into which the light source slot section is inserted and which is connected to the light source slot section. The main control section optionally varies a wavelength and an output level of the laser light from the light source slot section. An optical connecting mechanism between the light source slot section and the main control section supplies the main control section with a part of laser light from the light source slot section.

6 Claims, 6 Drawing Sheets

WAVELENGTH VARIABLE LIGHT SOURCE APPARATUS WITH AN OPTICAL CONNECTOR BETWEEN A LIGHT SOURCE SLOT SECTION AND A MAIN CONTROL SECTION

BACKGROUND OF THE INVENTION

1. Field of the Invention

The present invention relates to a wavelength variable light source apparatus for use in optical measurement technical field or the like.

2. Description of the Related Art

Figure 7:
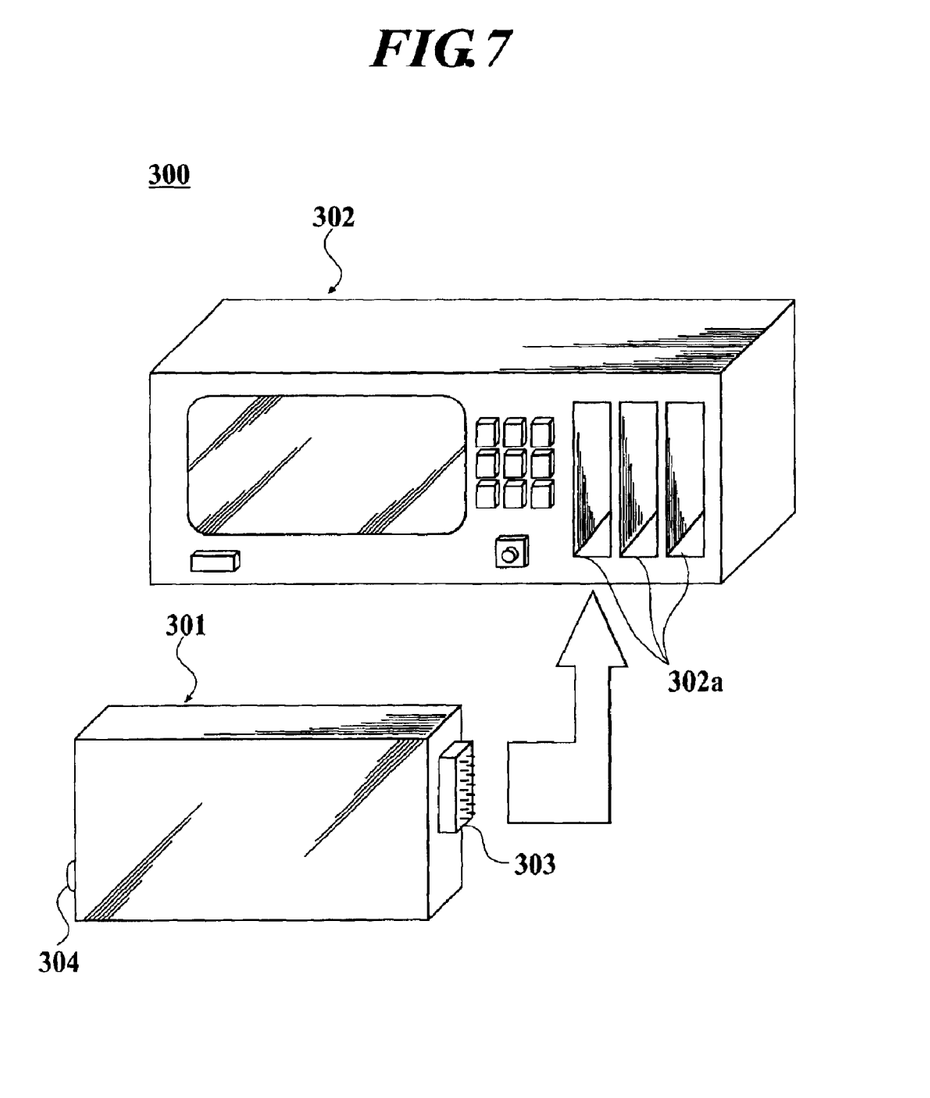
FIG. 7 shows a prospective view of a conventional wavelength variable light source apparatus.

As shown in FIG. 7, a wavelength variable light source apparatus 300 comprises a plurality of light source slot sections 301 and a main control section 302 (only one light source slot section is illustrated in FIG. 7). The light source slot sections 301 generate laser lights which have wavelength variable ranges different from one another, respectively. A selected one of the light source slot sections 301 may be inserted in one of plug sections 302a which are installed in the main control section 302, according to intended use.

The light source slot section 301 inserted in one of the plug sections 302a is connected to the main control section 302 through an electric connector 303 for use in control (communication) on optionally varying the wavelength and output level of the laser light which is outputted from the light source slot section 301. The electric connector 303 is installed on a back surface of the light source slot section 301. In addition, a light output connector 304 is installed on a front surface of the light source slot section 301.

By the way, the need for improvement of the light source wavelength precision is increasing year-by-year. In order to keep the wavelength of the laser light which is outputted from the light source slot section 301, with greater accuracy, a part of laser light is monitored by a wavelength detector such as a cymometer and compensation is carried out so as to make the wavelength of the laser light outputted from the light source slot section 301 be equal to a preset wavelength.

However, the light source slot section 301 is not optically connected to the main control section 302 and it is impossible to introduce the laser light outputted from the light source slot section 301, into the main control section 302, inasmuch as the light source slot section 301 is connected to the main control section 302 by only electric connector 303, in the above-mentioned conventional wavelength variable light source apparatus 300.

As a result, it is necessary to install an optical branch element or an optical fiber in the light output connector 304 which is installed on the front surface of the light source slot section 301 in order to branch off a part of laser light outputted from the light output connector 304, in case of monitoring the wavelength of the laser light outputted from the light source slot section 301, by the wavelength detector. In addition, a personal computer and special software need which are for use in compensating the wavelength of the laser light in accordance with wavelength information obtained by the wavelength detector. As a result, it is necessary to provide a wide working space.

Furthermore, the size of the light source slot section 301 increases inasmuch as each light source slot section 301 has the wavelength detector, in case where the wavelength detector is installed in each light source slot section 301. As a result, there is a problem in which the wavelength variable light source apparatus 300 is upsized. In addition, the number of the light source slot sections 301 decreases which is capable of being inserted into the main control section 302. The cost may increase with respect to the wavelength variable light source apparatus 300.

SUMMARY OF THE INVENTION

Taking the above-mentioned problems into consideration, it is an object of the present invention to provide a wavelength variable light source apparatus capable of easily introducing a laser light outputted from a light source slot section, into a main control section.

In order to solve the above-mentioned problems, there is provided a wavelength variable light source apparatus comprising a light source slot section for generating a laser light and a main control section into which the light source slot section is inserted and which is connected to the light source slot section, the main control section optionally varying a wavelength and an output level of the laser light which is outputted from the light source slot section. An optical connecting mechanism is installed at a connecting section between the light source slot section and the main control section. The optical connecting mechanism supplies the main control section with a part of laser light which is outputted from the light source slot section.

According to the present invention, it is unnecessary to connect a light branching element or an optical fiber to a connector which is installed on a front surface of the light source slot section, inasmuch as the optical connecting mechanism is installed at the connecting section between the light source slot section and the main control section and supplies the main control section with a part of laser light which is outputted from the light source slot section. When the light source slot section is inserted into the main control section, it is possible to easily supply the main control section with a part of laser light which is outputted from the light source slot section, through the optical connecting mechanism.

In the present invention, the optical connecting mechanism has a light connector which is capable of making an optical contact.

According to the present invention, it is possible to optically connect the light source slot section to the main control section with high connecting efficiency, inasmuch as the optical connecting mechanism has the light connector which is capable of making the optical contact.

In the present invention, the optical connecting mechanism makes a non-contact connection based on a spatial light.

According to the present invention, it is possible to avoid the mechanical fracture on connecting the light source slot section to the main control section, inasmuch as the optical connecting mechanism uses the non-contact connection based on the spatial light, without a physical contact.

In the present invention, the main control section comprises a wavelength compensating section for detecting the wavelength of the laser light outputted from the light source slot section, to compensate the detected wavelength of the laser light into a predetermined set wavelength.

According to the present invention, the laser light outputted from the light source slot section is introduced to the wavelength compensating section through the optical connecting mechanism. The wavelength compensating section detects the wavelength of the laser light to compensate the detected wavelength into the predetermined set wavelength, inasmuch as the main control section comprises the wavelength compensating section.

Therefore, it is unnecessary to use a personal computer, special software, and a communication cable in addition to the main control section inasmuch as it is possible to compensate the laser light by using only the light source slot section and the main control section. Furthermore it is unnecessary to provide the wide working space in comparison to the conventional wavelength variable light source apparatus.

In addition, it is possible to reduce the size of the light source slot section and to downsize the wavelength variable light source apparatus, inasmuch as it is unnecessary to install a wavelength detector in the light source slot section. Furthermore, it is possible to increase the number of the light source slot sections each of which is capable of being inserted into the main control section, inasmuch as it is possible to reduce the size of the light source slot section. It is possible to reduce the cost of the wavelength variable light source apparatus.

In the present invention, the wavelength variable light source apparatus comprises a plurality of light source slot sections for generating laser lights having wavelengths which are different from one another. An optical switch is installed in the main control section. The optical switch selectively connects the wavelength compensating section to any one of the light source slot sections to supply the wavelength compensating section with the laser light outputted from any one of the light source slot sections, on switching the optical switch.

According to the present invention, it is possible to compensate the wavelengths of the laser lights outputted from the light source slot sections, into the predetermined wavelengths which are set in the light source slot sections, respectively, by only one wavelength compensating section which is installed in the main control section, inasmuch as the optical switch supplies the wavelength compensating section with the laser light which is outputted from any one of the light source slot sections, on switching the optical switch.

In addition, it is possible to make the wavelength detecting efficiency be high without reducing the amount of light which is inputted to the wavelength compensating section, even though the number of the light source slot sections increases.

In the present invention, the wavelength variable light source apparatus comprises a plurality of light source slot sections for generating laser lights having wavelengths which are different from one another. A light branching element is installed in the main control section. The light branching element connects the wavelength compensating section to light source slot sections to supply the wavelength compensating section with the laser light outputted from any one of the light source slot sections.

According to the present invention, it is possible to compensate the wavelengths of the laser lights outputted from the light source slot sections, into the predetermined wavelengths which are set in the light source slot sections, respectively, by only one wavelength compensating section which is installed in the main control section, inasmuch as the wavelength compensating section is supplied with the laser light which is outputted from any one of the light source slot sections, by the light branching element.

PREFERRED EMBODIMENTS OF THE INVENTION

With reference to drawings, description will be made as regards embodiments according to the present invention.

Figure 1:
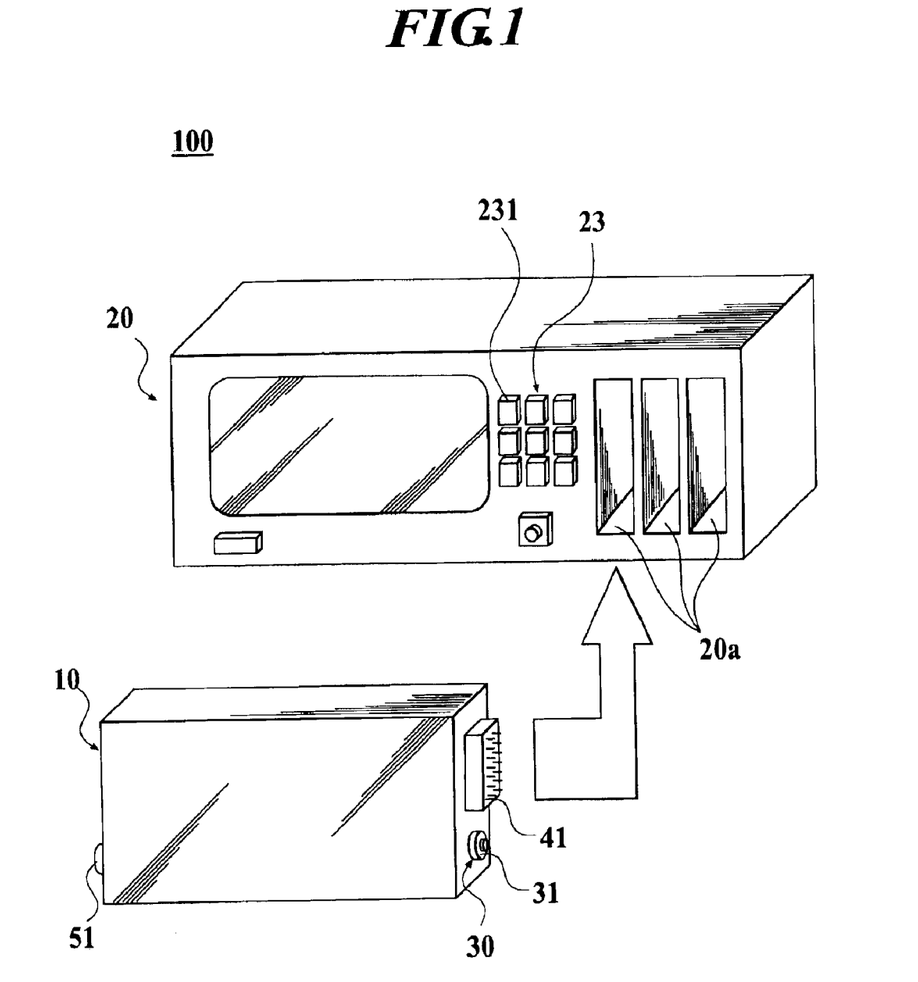
FIG. 1 shows a prospective view of a wavelength variable light source apparatus according to a first embodiment of the present invention.
Figure 2:
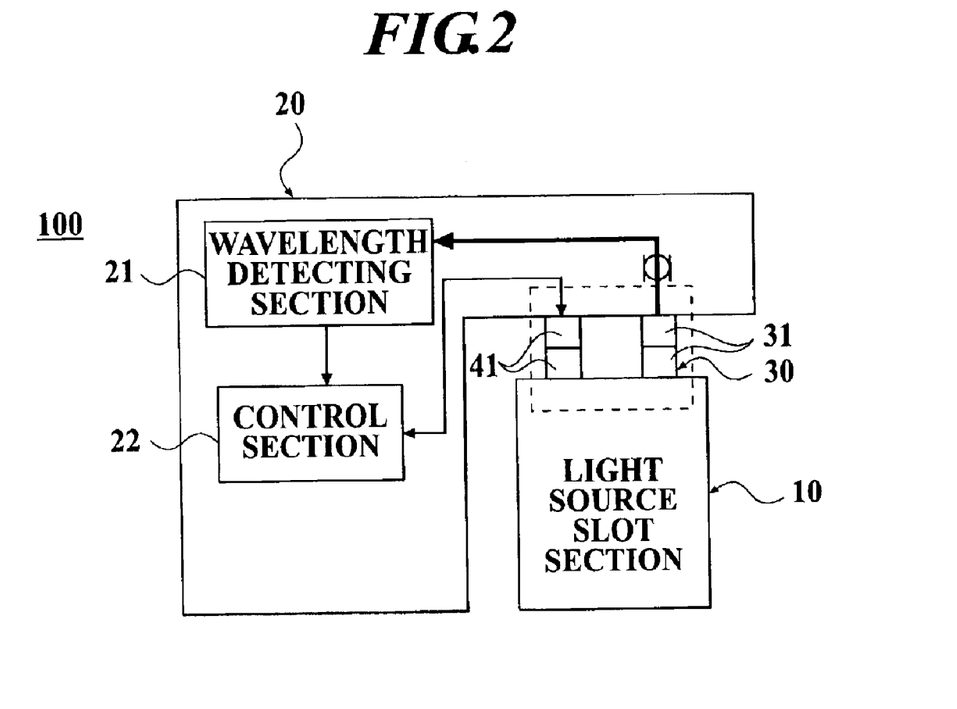
FIG. 2 is a block diagram for illustrating a brief configuration of the wavelength variable light source apparatus according to the first embodiment of the present invention.
Figure 3:
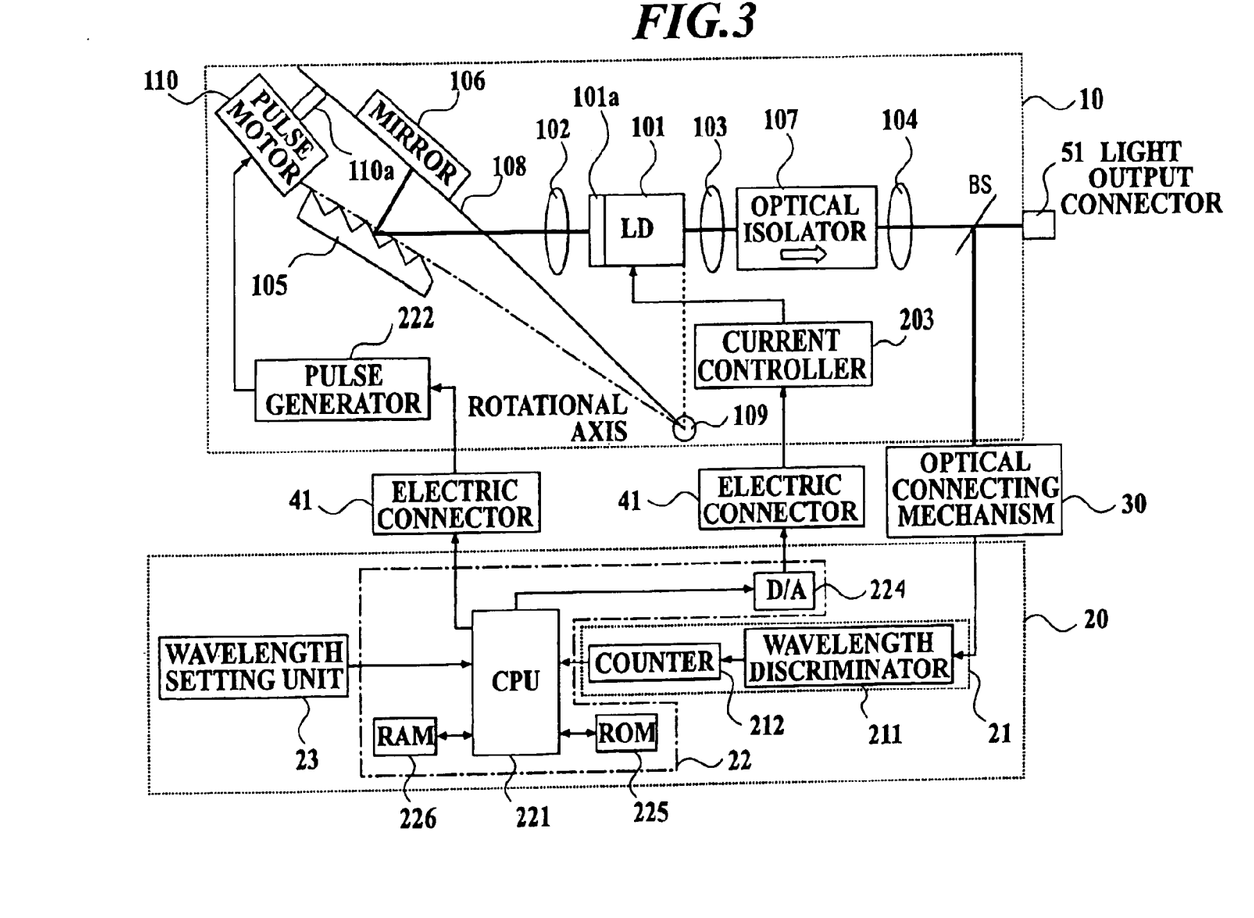
FIG. 3 is a block diagram for illustrating a functional configuration of the wavelength variable light source apparatus according to the first embodiment of the present invention.

FIG. 1 shows a prospective view of a wavelength variable light source apparatus according to a first embodiment of the present invention. FIG. 2 is a block diagram for illustrating a brief configuration of the wavelength variable light source apparatus. FIG. 3 is a block diagram for illustrating a functional configuration of the wavelength variable light source apparatus.

As shown in FIGS. 1 and 2, a wavelength variable light source apparatus 100 of the present invention comprises a light source slot section 10 for generating a laser light and a main control section 20 connected to the light source slot section 10 which is inserted into the main control section 20. The main control section 20 is for optionally varying the wavelength and the output level of the laser light which is outputted from the light source slot section 10.

The main control section 20 comprises a plurality of plug sections 20a with a predetermined interval. The light source slot section 10 is selectively inserted into one of the plug sections 20a. An optical connecting mechanism 30 is installed on a connecting section between the plug section 20a and the light source slot section 10. The optical connecting mechanism 30 is for introducing a part of laser light outputted from the light source slot section 10, into the main control section 20.

The optical connecting mechanism 30 is optical connectors 31 each of which is capable of making an optical contact. The optical connectors 31 are installed on the light source slot section 10 and the main control section 20, respectively. Each of the optical connectors 31 may be, for example, FC type or SC type. Taking the easiness of removability into consideration, it is preferable to use the optical connector 31 of SC type.

In addition, the optical connector 31 may be integral with the electric connector 41 in the optical connecting mechanism 30.

In addition, the light source slot section 10 has a roughly rectangular parallelepiped shape. The optical connector 31 and the electric connector 41 are installed on the back surface of the light source slot section 10. The light output connector 51 is installed on the front surface of the light source slot section 10.

By the above-mentioned structure, it is possible to connect the light source slot section 30 to the main control section 20 electrically and optically, when the light source slot section 10 is inserted into the plug section 20a of the main control section 20.

Incidentally, input keys 231 (wavelength setting section 23) is installed on the front surface of the main control section 20, as will be described hereinafter.

Now, description will be made as regards a functional configuration of the wavelength variable light source apparatus 100 of the present invention.

As shown in FIG. 3, the light source slot section 10 has a semiconductor laser (LD) 101, lenses 102, 103, and 104, a diffraction grating 105, a mirror 106, an optical isolator 107, an arm 108, and a pulse motor 110 all of which are unitized. Incidentally, a non-reflective film 101a is formed on an end face of the diffraction grating side in the LD 101.

In the light source slot section 10, an output light outputted from the end face on which the non-reflective film 101a is formed in the LD 101, is converted into a parallel light by the lens 102 to be inputted to the diffraction grating 105. A light having a wavelength which is determined on the basis of the physical relationship between the diffraction grating 105 and the mirror 106, is fed back to the LD 101. As a result, LD 101 generates a laser light having the above-mentioned wavelength. The laser light generated in the LD 101 outputs from another end face of the LD 101 to be converted into a parallel light by the lens 103. The parallel light outputted from the lens 103 passes through the optical isolator 107 to be collected by the lens 104. By the light connector 31 (the optical connecting mechanism 30),the collected light is supplied as an output light to a wavelength detecting section 21 of the main control section 20 that will be described hereinafter.

Incidentally, one end portion of the arm 108 is pivotally attached to a rotational axis 109. Another end portion of the arm 108 is supported to the drift axis 110a of the pulse motor 110. The pulse motor 110 makes the arm 108 wobble around the rotational axis 109 under a control of a control section 22 which will be described hereinafter, in order to mechanically adjust the generated wavelength of the LD 101.

On the other hand, the main control section 20 comprises the wavelength detecting section 21, the control section 22, and a wavelength setting unit 23. The wavelength detecting section 21 and the control section 22 collectively serve as a wavelength compensating section.

The wavelength detecting section 21 is for detecting the wavelength of the laser light which is outputted from the light source slot section 10. For example, a cymometer may be used as the wavelength detecting section 21. The wavelength detecting section 21 comprises a wavelength discriminator 211 and a counter 212.

The control section 22 comprises a CPU (Central Processing Unit) 221, a pulse generator 222, a current controller 223, a D/A converter 224, a ROM (Read Only Memory) 225, and a RAM (Random Access Memory) 226.

The wavelength setting unit 23 has the input keys 231 (referring to FIG. 1) for setting a desired light power and a desired wavelength (for example, the wave length may be equal to 0.1 pm or less).

The wavelength discriminator 211 discriminates the wavelength of the laser light which is inputted through the light connector 31. The counter 212 is supplied with the output of the wavelength discriminator 211 to count the period, in order to output the count result as a digital signal to the CPU 221.

The CPU 221 outputs a control signal to the pulse generator 222 and the current controller 223 in accordance with digital signal which is outputted from the counter 212, in order to control the pulse generator 222 and the current controller 223.

The pulse generator 222 generates a pulse signal having pulses of number based on the control signal supplied from the CPU 221, in order to supply the pulse signal to the pulse motor 110.

The current controller 223 always supplies the LD 101 with a threshold current which is for use in making the LD 101 generate the laser light, through the D/A converter 224 and the electric connector 41. Furthermore, the current controller 223 supplies the LD 101 with a driving current based on the control signal which is supplied from the CPU 221, in addition to the threshold current, through the D/A converter 224.

Although no illustration is made, the ROM 225 previously stores a first table, a second table, and a third table. The first table is representative of a correspondence relationship between the wavelength and the number o pulses. The second table is representative of a correspondence relationship between the wavelength of the laser light generated by the LD 101 and the driving current value. The third table is representative of a correspondence relationship between the wavelength of the laser light generated by the LD 101 and a peak voltage value or the peak current value of the electric signal obtained by converting the laser light into the electric signal.

Next, description will proceed to operation of the wavelength variable light source apparatus 100 having the above-mentioned configuration.

At first, an operator sets a desired wavelength in the wavelength setting unit 23. When the CPU 221 detects that the desired wavelength is set in the wavelength setting unit 23, the CPU 221 stores the set wavelength in the RAM 226. Subsequently, the CPU 221 makes approximations with respect to the set wavelength stored in the RAM 225, at an order of 100 nm. Furthermore, the CPU 221 recognizes the number of pulses that corresponds to the approximate wavelength, with reference to the first table stored in the ROM 225. The CPU 221 makes the pulse generator 222 generate the pulse signal having the pulses of recognized number. The pulse signal generated by the pulse generator 222 is supplied to the pulse motor 110 through the electric connector 41. The pulse motor 110 makes the drift axis 110a drift in and out in accordance with the pulse signal, in order to change the attitude of the mirror 106. In the manner described above, the wavelength of the laser light generated by the LD 101 is roughly set.

Subsequently, the CPU 221 substrates the above-mentioned approximate wavelength from the set wavelength stored in the RAM 226, in order to obtain a difference wavelength. The CPU 221 recognizes the driving current value which corresponds to the difference wavelength, with reference to the second table stored in the ROM 225. The CPU 221 makes the current controller 223 control the recognized driving current. In addition to the threshold current, the current controller 223 further supplies the LD 101 with the driving current based on an instruction which is supplied from the CPU 221, through the D/A converter 224 and the electric connector 41. In the maimer described above, the wavelength of the laser light generated by the LD 101 is set in detail.

Subsequently, CPU 221 always monitors the wavelength of the laser light through the light connector 31 in accordance with the digital signal which is supplied from the counter 212. More particularly, the CPU 221 recognizes the wavelength corresponding to the peak current value of the digital signal, with reference to the third table stored in the ROM 225. In other words, the CPU 221 recognizes the wavelength of the laser light which the LD 101 generates at present. In case where the recognized wavelength deviates from the set wavelength which is stored in RAM 226, the CPU 221 calculates a difference between the set wavelength and the present wavelength. The CPU 221 again refers to the third table and recognizes the driving current value corresponding to the difference. The CPU 221 makes the current controller 223 increase or decrease the driving current in accordance with the recognized driving current value. In the manner described above, compensation is carried out with respect to the wavelength of the laser light which is generated from the LD 101 of the light source slot section 10.

When the driving current supplied to the LD 101 is changed as described above, it is possible to change the output level of the laser light which is generated from the LD 101 of the light source slot section 10. Alternatively, a light attenuator (light ATT) may be installed in the main control section 20, in case of changing the output level of the laser light generated from the LD 101. The light attenuator attenuates the strength of the laser light which is outputted from the light connector 31.

According to the first embodiment of the present invention, it is possible to easily introduce a part of laser light outputted from the light source slot section 10, through the optical connecting mechanism 30, when the light source slot section 10 is inserted into the plug section 20a of the main control section 20, inasmuch as the optical connecting mechanism 30, which introduces a part of laser light outputted from the light source slot section 10 into the main control section 20, is installed on the connecting section between the light source slot section 10 and the main control section 20. In other words, the light source slot section 10 is optically connected to the main control section 20.

Inasmuch as the optical connecting mechanism 30 comprises the light connectors 31 each of which is capable of making the optical contact, it is possible to connect the light source slot section 10 to the main control section 20 with a high connection efficiency.

Inasmuch as the main control section 20 comprises the wavelength compensating section (wavelength detecting section 21 and the control section 22), the wavelength compensating section detects the wavelength of the laser light which is outputted from the light source slot section 10. The wavelength compensating section carries out the compensation so that the detected wavelength becomes equal to a predetermined set wavelength.

Accordingly, it is unnecessary to provide the wide working space in comparison with the conventional wavelength variable light source apparatus, inasmuch as it is possible to compensate the wavelength of the laser light outputted from the light source slot section 10, into the predetermined wavelength by using only the light source slot section 10 and the main control section 20. In addition, it is possible to reduce the size of the light source slot section 10 and to downsize the wavelength variable light source apparatus 100, inasmuch as it is unnecessary to install the wavelength detector in the light source slot section 10. Furthermore, it is possible to increase the number of light source slot sections 10 each of which is capable of being inserted into the main control section 20. It is possible to reduce the cost of the wavelength variable light source apparatus 100.

Figure 4:
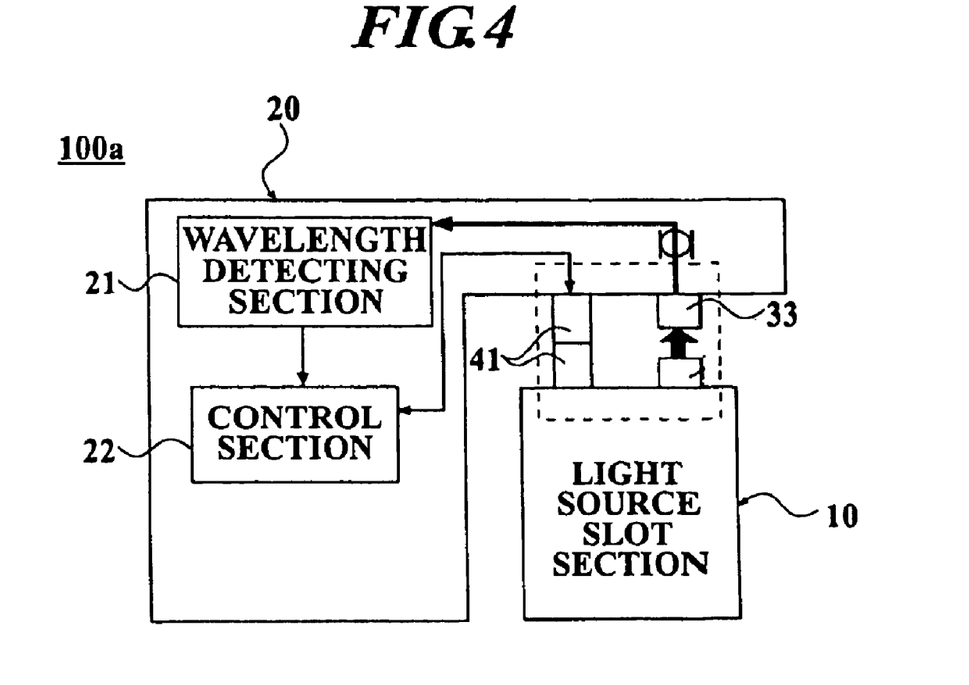
FIG. 4 is a block diagram for illustrating a brief configuration of a wavelength variable light source apparatus according to a second embodiment of the present invention.

FIG. 4 is a block diagram for illustrating a brief configuration of a wavelength variable light source apparatus according to a second embodiment of the present invention.

As shown in FIG. 4, a wavelength variable light source apparatus 100a of the present invention is different from the wavelength variable light source apparatus 100 of the first embodiment. The wavelength variable light source apparatus 100a includes a non-contact connection state by a spatial light. More particularly, an optical collimator is used which converts the light outputted from the optical fiber, into the parallel light by a lens 33.

Incidentally, the parts which are similar to the first embodiment will be designated by same reference numerals in the FIG. 4 and the description will be omitted.

According to the second embodiment of the present invention, it is possible to avoid the mechanical fracture when the light source slot section 10 is connected to the main control section 20, inasmuch as the optical connecting mechanism 30 becomes the non-contact connection by the spatial light without physical contact which is used in the wavelength variable light source apparatus 100 of the first embodiment.

Figure 5:
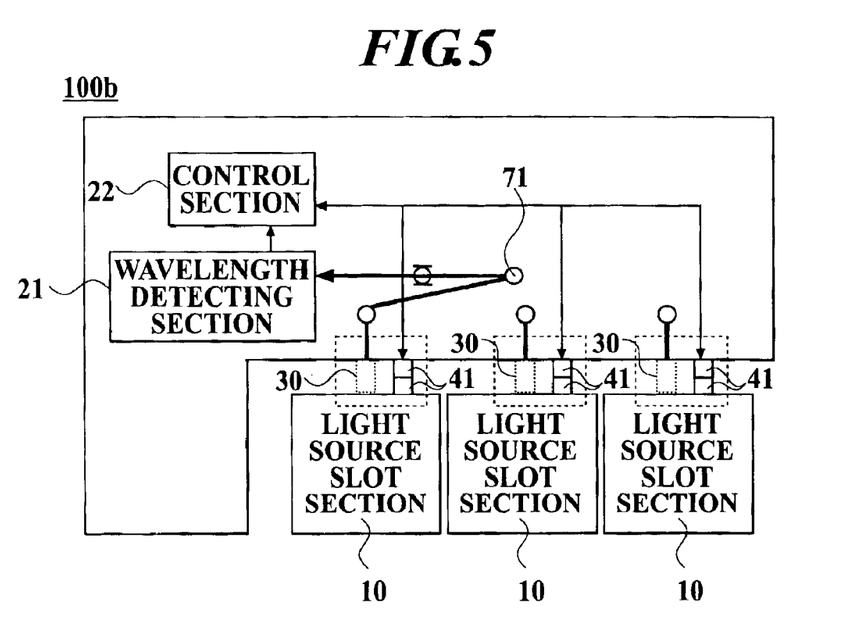
FIG. 5 is a block diagram for illustrating a brief configuration of a wavelength variable light source apparatus according to a third embodiment of the present invention.

FIG. 5 is a block diagram for illustrating a brief configuration of a wavelength variable light source apparatus according to a third embodiment of the present invention.

As shown in FIG. 5, a wavelength variable light source apparatus 100b of the present invention comprises a plurality of light source slot sections 10 which generate laser lights having wavelengths different from one another. The light source slot sections 10 are inserted into the plug sections 20a of the main control section 20, respectively. The light source slot sections 10 are connected to the main control section 20 by the optical connecting mechanisms 30 and the electric connectors 41. In addition, the main control section 20 comprises the wavelength compensating section composed of the wavelength detecting section 21 and the control section 22 described in conjunction with the first embodiment.

Incidentally, each of the optical connecting mechanisms 30 may be the above-mentioned light connectors 31 or the optical collimator.

An optical switch 71 is installed in the main control section 20. The optical switch 71 is for selectively connecting the wavelength detecting section 21 to one of the light source slot sections 10. The optical switch 71 supplies the wavelength detecting section 21 with the laser light outputted from any one of the light source slot sections 10 that is selected from the light source slot sections 10 by switching the optical switch 71. In other words, the optical switch 71 is selectively connected to one of the optical connecting mechanisms 30 which are installed in the light source slot sections 10, respectively, on switching the optical switch 71.

When the wavelength detecting section 21 detects the deviation between the set wavelength and the wavelength of the laser light which is supplied to the wavelength detecting section 21, in the similar manner described in conjunction with the first embodiment, the control section 22 compensates the wavelength of the laser light into the set wavelength. As described above, it is possible to compensate the wavelength deviation with respect to each of the light source slot sections 10.

Incidentally, the parts which are similar to the first embodiment will be designated by same reference numerals in the FIG. 5 and the description will be omitted.

According to the third embodiment of the present invention, it is possible to compensate the wavelengths of the laser lights outputted from the light source slot sections 10, into the predetermined wavelengths which are set in the light source slot sections 10, respectively, by only one wavelength compensating section, inasmuch as the wavelength compensating section (wavelength detecting section 21 and the control section 22) is supplied with the laser light which is outputted from any one of the light source slot sections 10, by switching the optical switch 71.

Figure 6:
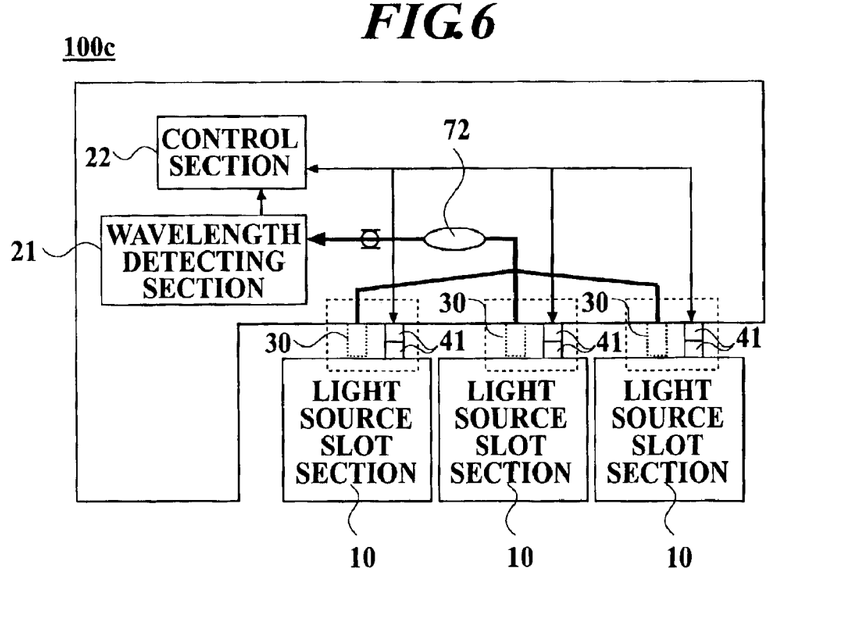
FIG. 6 is a block diagram for illustrating a brief configuration of a wavelength variable light source apparatus according to a fourth embodiment of the present invention.

In addition, the wavelength variable light source apparatus 100b according to the third embodiment is superior in wavelength detecting efficiency to a wavelength variable light source apparatus 100c according to a fourth embodiment that will be described hereinafter, inasmuch as the amount of light does not reduce which is inputted to the wavelength compensating section, even if the number of the light source slot sections 10 increases in comparison to the wavelength variable light source apparatus 100c according to the fourth embodiment.

FIG. 6 is a block diagram for illustrating a brief configuration of a wavelength variable light source apparatus according to the fourth embodiment of the present invention.

As shown in FIG. 6, the wavelength variable light source apparatus 100c of the present invention comprises a light branching element 72 instead of the optical switch 71 which connects any one of the light source slot sections 10 to the wavelength detecting section 21 and which is described in conjunction with the third embodiment.

More particularly, the light branching element 72 is installed in the main control section 20. The light branching element 72 is for connecting any one of the light source slot sections 10 to the wavelength detecting section 21. The light branching element 72 supplies the wavelength detecting section 21 with the laser light which is outputted from any one of the light source slot sections 10. When the wavelength detecting section 21 detects the deviation between the set wavelength and the wavelength of the laser light which is supplied to the wavelength detecting section 21, in the similar manner described in conjunction with the first embodiment, the control section 22 compensates the wavelength of the laser light into the set wavelength. As described above, it is possible to compensate the wavelength deviation with respect to each of the light source slot sections 10.

Incidentally, the parts which are similar to the first embodiment will be designated by same reference numerals in the FIG. 6 and the description will be omitted.

According to the fourth embodiment of the present invention, it is possible to compensate the wavelengths of the laser lights outputted from the light source slot sections 10, into the predetermined wavelengths which are set in the light source slot sections 10, respectively, by only one wavelength compensating section, inasmuch as the wavelength compensating section (wavelength detecting section 21 and the control section 22) is supplied with the laser light which is outputted from any one of the light source slot sections 10, by the light branching element 72.

Although the optical connecting mechanism 30 is installed on the back surface of the light source slot section 10 in each of embodiments of the present invention, it is possible to install the optical connecting mechanism 30 on all locations of the light source slot section 10 without limiting the back surface of the light source slot section 10, if the light source slot section 10 is optically connected to the main control section 20.

In addition, it is possible to use a DC servomotor, an AC servomotor, or the like, although the pulse motor 110 is used as a motor in each of the embodiments of the present invention.

Furthermore, it is possible to use the wavelength variable light source apparatus 100 of the present invention as a frequency (wavelength) stabilized light source which is for locking the wavelength to a wavelength reference such as a wavelength locker, in case of slightly varying the wavelength in accordance with variation of the driving current or variation of temperature.

In addition, it is possible to modify the wavelength variable light source apparatus 100 in the configuration and the operation without going out of scope of sprit of the present invention.

According to the present invention, it is possible to easily supply the main control section with a part of laser light which is outputted from the light source slot section, through the optical connecting mechanism, when inserting the light source slot section to the main control section.

According to the present invention, it is possible to optically connect the light source slot section to the main control section with high connecting efficiency, inasmuch as the optical connecting mechanism is the light connectors which are capable of making an optical contact.

According to the present invention, it is possible to avoid the mechanical fracture on connecting the light source slot section to the main control section, inasmuch as the optical connecting mechanism uses a non-contact connection based on the spatial light.

According to the present invention, the wavelength compensating section detects the wavelength of the laser light which is outputted from the light source slot section. The wavelength compensating section compensates the detected wavelength into the predetermined wavelength.

Therefore, it is unnecessary to provide the wide working space in comparison to the conventional wavelength variable light source apparatus. In addition, it is possible to reduce the size of the light source slot section and to downsize the wavelength variable light source apparatus. Furthermore, it is possible to increase the number of the light source slot sections each of which is capable of being inserted into the main control section. It is possible to reduce the cost of the wavelength variable light source apparatus.

According to the present invention, it is possible to compensate the wavelengths of the laser lights outputted from the light source slot sections, into the predetermined wavelengths which are set in the light source slot sections, respectively, by the wavelength compensating section, on switching the optical switch.

In addition, it is possible to make the wavelength detecting efficiency be high without reducing the amount of light which is inputted to the wavelength compensating section, even though the number of the light source slot sections increases.

According to the present invention, it is possible to compensate the wavelengths of the laser lights outputted from the light source slot sections, into the predetermined wavelengths which are set in the light source slot sections, respectively, by the wavelength compensating section, inasmuch as the wavelength compensating section is supplied with the laser light which is outputted from any one of the light source slot sections, by the light branching element.

What is claimed is:

1. A wavelength variable light source apparatus comprising a light source slot section for generating a laser light and a main control section into which the light source slot section is inserted and which is connected to the light source slot section, the main control section optionally varying a wavelength and an output level of the laser light from the light source slot section, wherein:

an optical connecting mechanism is at a connecting section between the light source slot section and the main control section; and the optical connecting mechanism is for supplying the main control section with a part of laser light from the light source slot section.

2. A wavelength variable light source apparatus as claimed in claim 1, wherein the optical connecting mechanism has a light connector capable of making an optical contact.

3. A wavelength variable light source apparatus as claimed in claim 1, wherein the optical connecting mechanism makes a non-contact connection based on a spatial light.

4. A wavelength variable light source apparatus as claimed in any one of claims 1 to 3, wherein the main control section comprises a wavelength compensating section for detecting the wavelength of the laser light from the light source slot section, to compensate the detected wavelength of the laser light into a predetermined set wavelength.

5. A wavelength variable light source apparatus as claimed in claim 4, wherein:

the wavelength variable light source apparatus comprises a plurality of light source slot sections for generating laser lights having wavelengths that are different from one another;

an optical switch in the main control section, the optical switch selectively connecting the wavelength compensating section to any one of the light source slot sections; and the optical switch supplying the wavelength compensating section with the laser light from any one of the light source slot sections, on switching the optical switch.

6. A wavelength variable light source apparatus as claimed in claim 4, wherein:

the wavelength variable light source apparatus comprises a plurality of light source slot sections for generating laser lights having wavelengths that are different from one another; and a light branching element in the main control section, the light branching element connecting the wavelength compensating section to light source slot sections to supply the wavelength compensating section with the laser light from any one of the light source slot sections.

* * * * *